United States Patent
Mantegazza et al.

(10) Patent No.: US 9,613,691 B2
(45) Date of Patent: Apr. 4, 2017

(54) APPARATUS AND METHOD FOR DRIFT CANCELLATION IN A MEMORY

(71) Applicant: Intel Corporation, Santa Clara, CA (US)

(72) Inventors: Davide Mantegazza, Palo Alto, CA (US); Prashant S. Damle, Santa Clara, CA (US); Kiran Pangal, Fremont, CA (US); Hanmant P. Belgal, El Dorado Hills, CA (US); Abhinav Pandey, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/671,972

(22) Filed: Mar. 27, 2015

(65) Prior Publication Data

US 2016/0284399 A1     Sep. 29, 2016

(51) Int. Cl.
*G11C 5/14*       (2006.01)
*G11C 13/00*      (2006.01)
*G11C 11/56*      (2006.01)

(52) U.S. Cl.
CPC ........ *G11C 13/004* (2013.01); *G11C 13/0004* (2013.01); *G11C 13/0033* (2013.01);
(Continued)

(58) Field of Classification Search
CPC .............. G11C 13/004; G11C 13/0033; G11C 11/5678; G11C 13/0004; G11C 13/0069;
(Continued)

(56) References Cited

U.S. PATENT DOCUMENTS

| | | | | |
|---|---|---|---|---|
| 5,659,519 A | * | 8/1997 | Lee | G11C 5/145 |
| | | | | 365/189.09 |
| 6,377,495 B1 | * | 4/2002 | Lorenz | G11C 7/062 |
| | | | | 365/185.21 |

(Continued)

FOREIGN PATENT DOCUMENTS

| | | |
|---|---|---|
| JP | 2006344349 | 12/2006 |
| JP | 4313372 | 8/2009 |
| WO | 2013184111 A1 | 12/2013 |

OTHER PUBLICATIONS

Notice of Allowance for U.S. Appl. No. 14/204,376, mailed on Oct. 26, 2015.

(Continued)

*Primary Examiner* — Pho M Luu
(74) *Attorney, Agent, or Firm* — Green, Howard & Mughal, LLP

(57) ABSTRACT

An apparatus is provided which comprises: a plurality of memory cells; a bias logic coupled with at least one memory cell of the plurality, the bias logic to: apply a first read voltage to the at least one memory cell; and apply a second read voltage to the at least one memory cell, the first read voltage being higher than the second read voltage; and a first circuit operable to float a word-line coupled to the at least one memory cell before the bias logic applies the first read voltage to the at least one memory cell. A method is provided which comprises: performing a first read operation to at least one memory cell; and performing a second read operation to the at least one memory cell after the first read operation completes, wherein the second read operation is different from the first read operation.

20 Claims, 4 Drawing Sheets

(52) U.S. Cl.
CPC ...... *G11C 11/5678* (2013.01); *G11C 13/0069* (2013.01); *G11C 13/0097* (2013.01); *G11C 2013/0052* (2013.01); *G11C 2013/0057* (2013.01); *G11C 2013/0083* (2013.01)

(58) Field of Classification Search
CPC ........ G11C 13/0097; G11C 2013/0052; G11C 2013/0057; G11C 2013/0083
USPC ............................ 365/189.09, 189.011, 233.1
See application file for complete search history.

(56) References Cited

U.S. PATENT DOCUMENTS

| | | | |
|---|---|---|---|
| 6,754,107 B2 | 6/2004 | Khouri et al. | |
| 7,046,543 B2 | 5/2006 | Arimoto et al. | |
| 7,405,964 B2 | 7/2008 | Phillipp et al. | |
| 7,542,368 B2* | 6/2009 | Ishikura | G11C 29/12005 365/154 |
| 7,642,864 B2* | 1/2010 | Chuang | H03K 3/0315 324/600 |
| 8,466,707 B2* | 6/2013 | Mohammad | G01R 31/2642 324/762.01 |
| 9,030,906 B2 | 5/2015 | Rivers et al. | |
| 2003/0002338 A1 | 1/2003 | Xu et al. | |
| 2003/0128598 A1 | 7/2003 | Lim et al. | |
| 2009/0046495 A1 | 2/2009 | Shimaoka | |
| 2009/0052236 A1 | 2/2009 | Bae | |
| 2009/0157993 A1 | 6/2009 | Garrett | |
| 2010/0027326 A1 | 2/2010 | Kim et al. | |
| 2010/0149857 A1 | 6/2010 | Tang | |
| 2011/0103139 A1 | 5/2011 | Kau et al. | |
| 2011/0188305 A1 | 8/2011 | Yang | |
| 2011/0292712 A1 | 12/2011 | Perner | |
| 2012/0014173 A1 | 1/2012 | Deng | |
| 2012/0327708 A1 | 12/2012 | Du | |
| 2013/0135925 A1 | 5/2013 | Scheuerlein | |
| 2014/0098593 A1 | 4/2014 | Calderoni et al. | |
| 2014/0376308 A1 | 12/2014 | Wu et al. | |
| 2015/0255150 A1 | 9/2015 | Kim | |
| 2015/0262661 A1 | 9/2015 | Chu et al. | |
| 2015/0302937 A1 | 10/2015 | Roberts | |
| 2016/0049209 A1 | 2/2016 | Pandey et al. | |

OTHER PUBLICATIONS

Non-Final Office Action mailed Oct. 2, 2014 for U.S. Appl. No. 13/995,230.
Notice of Allowance mailed Jan. 23, 2015 for U.S. Appl. No. 13/995,230.
Wikipedia, "Phase-Change Memory", Phase-Change memory—Wikipedia, the free encyclopedia, Mar. 9, 2012, 11 pages. Retrieved from: http://en.wikipedia.org/wiki/Phase-change_memory.
International Search Report and Written Opinion mailed Aug. 20, 2013, for PCT/US2012/041166.
International Preliminary Report on Patentability mailed Dec. 9, 2014, for PCT/US2012/041166.
Dffice Action for U.S. Appl. No. 14/461,154, mailed on Oct. 30, 2015.
Notice of Allowance for U.S. Appl. No. 14/461,154, mailed on Mar. 1, 2016.
International Search Report and Written Opinion for PCT/US16/18337 mailed Jun. 8, 2016, 11 pages.
Office Action and Search Report for Taiwan Patent Application No. 105104813 mailed Dec. 22, 2016, 7 pages.

* cited by examiner

APPARATUS AND METHOD FOR DRIFT CANCELLATION IN A MEMORY

BACKGROUND

In a non-volatile memory, for example a Phase Change Memory (PCM), memory cells of the PCM may typically be set to a first threshold voltage or a second threshold voltage, depending on the data being stored in the memory cell. For example, the first threshold voltage may correspond to a first state (e.g., SET state) of the memory cell, and the second threshold voltage may correspond to a second state (e.g., RESET state) of the memory cell. In order to identify which of the two states the memory cell is in, a read voltage may be applied to the memory cell, and compared to the threshold voltage of the memory cell. Based on that comparison, the state of the memory cell may be identified.

PCM is a memory device which typically uses a chalcogenide material for its memory elements. Chalcogenide based devices and Chalcogenide like devices are affected by shift of the threshold voltage over-time. For example, once a programming pulse (e.g., a write pulse) is applied to the chalcogenide based memory (e.g., a PCM), its threshold voltage may shift, a phenomenon referred to as "drift." Drift negatively affects the memory read margin because the drift (e.g., an increase in the threshold voltage) shifts the optimum read voltage. In some cases, the threshold voltage may increase above the maximum voltage that can be applied to the memory, which makes reading from the memory a challenge.

Drift may also prevent realization of multi-level threshold memory. In a multi-level threshold memory, data is stored at different threshold voltage levels in the memory cell. A shift in the threshold voltages makes a multi-level (or multi-threshold) memory all but useless. One reason for that is the read voltages required to read data from the different threshold voltage levels are not known with high confidence.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figures 1, 2:
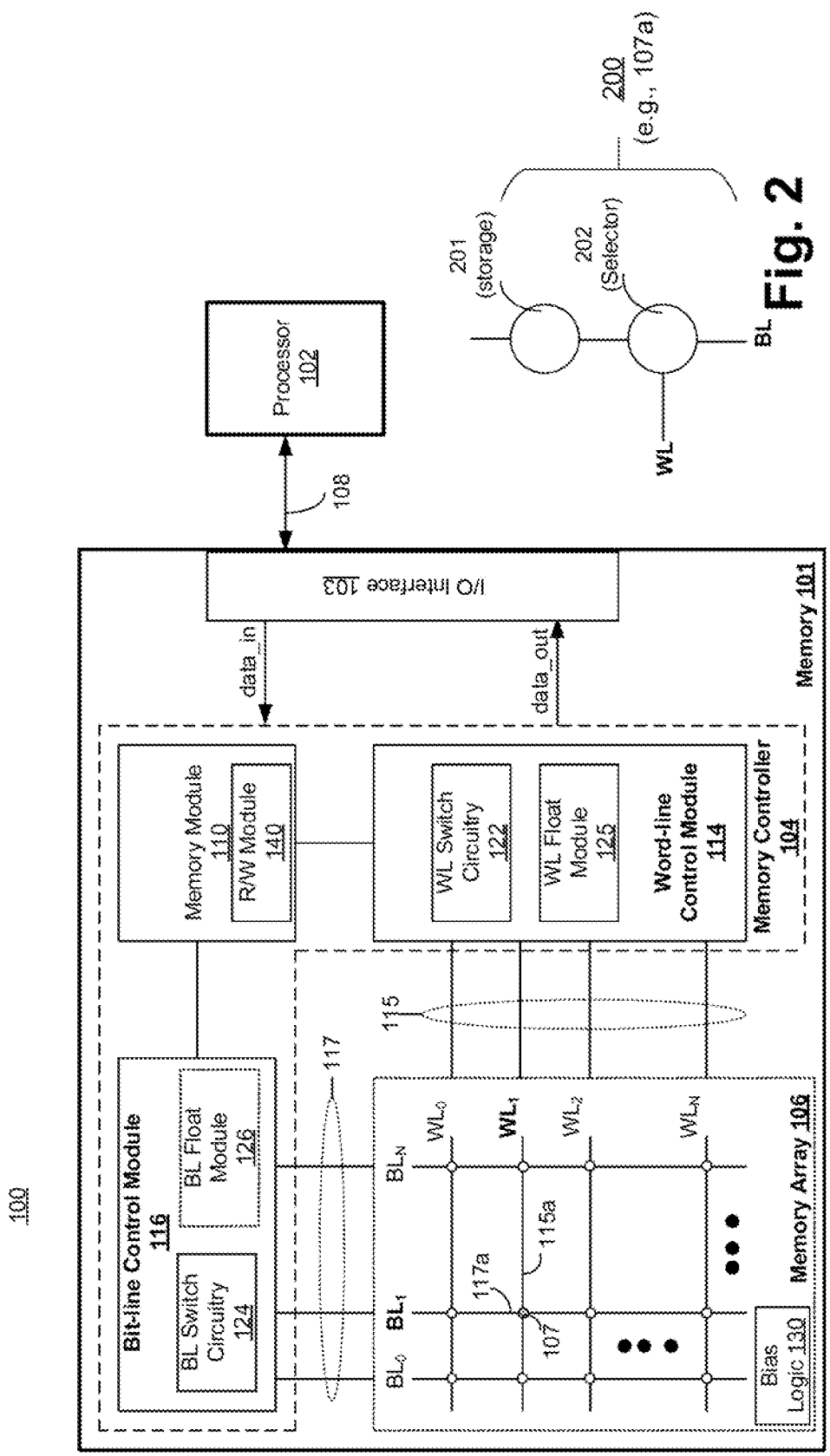
FIG. 1 illustrates a memory architecture with an apparatus to cancel drift, according to some embodiments of the disclosure.
FIG. 2 illustrates a cross-point memory cell with a storage unit and a selector unit, where the storage unit is operable to cancel drift, according to some embodiments of the disclosure.

Some embodiments described here cancel a shift in threshold voltage ("drift") in materials that are operable to refresh at least one property (e.g., threshold voltage) of the material upon application of a first read operation. After the first read operation completes, a normal read operation is performed (i.e., second read operation), where the second read operation is a different operation than the first read operation. In some embodiments, the material is a chalcogenide or chalcogenide like material. The chalcogenide material may exhibit either a crystalline or an amorphous phase, exhibiting a low or high conductivity. Generally, the amorphous phase has a low conductivity (i.e., high impedance) and is associated with a RESET state (i.e., logic zero) and the crystalline phase has a high conductivity (i.e., low impedance) and is associated with a SET state (i.e., logic one).

In some embodiments, an apparatus and method is provided to cancel a drift in chalcogenide or chalcogenide like devices by using a double pulse read operation. In some embodiments, in the double pulse read operation, a first read operation is performed and completed prior to starting a second read operation. In some embodiments, the first read operation comprises pre-charging one of a word-line (WL) or a bit-line (BL). Then, in some embodiments, one of the pre-charged WL or the pre-charged BL is floated (i.e., not driven by a driver).

For example, the WL or BL is pre-charged to approximately half the read voltage, or some other fraction of the read voltage, and then the WL or BL driver is tri-stated to cause the WL or BL to float such that the floated line (either WL or BL) is at a pre-charged state of approximately half the read voltage, or some other fraction of the read voltage. In some embodiments, voltage of one of the un-floating lines (either WL or BL) is increased to a voltage sufficient to select at least one memory cell from a plurality of memory cells. In some embodiments, voltage of one of the un-floating lines is increased such that the full read voltage is applied to the selected memory cell. This increased voltage is the first read voltage.

In some embodiments, after selecting the at least one memory cell, a first read voltage is applied to the selected at least one memory cell. In some embodiments, applying the first read voltage is performed by applying a first read pulse whose amplitude is sufficient to cancel the drift in the selected memory cell. In some embodiments, the first high voltage pulse has an amplitude which is sufficient that it cancels or removes the drift without disturbing or programming the selected (and/or unselected) cells.

In some embodiments, after the first read pulse completes, the second read operation is applied. In some embodiments, performing the second read operation comprises applying a second read voltage to the selected at least one memory cell without floating the WL or the BL. In some embodiments, the second read voltage is applied as a second read pulse, which is applied after the first read pulse completes (i.e., after detection of falling edge of the first read pulse). In some embodiments, the second read voltage (or amplitude) is a normal read voltage (i.e., voltage level sufficient for reading data from a memory cell during usual operation of the memory). The voltage level (or amplitude) of the normal read voltage (i.e., the second read voltage) is lower than the voltage level (or amplitude) of the first read pulse. For example, the amplitude of the first read pulse is 8.5V while the amplitude of the second read pulse is 6.5V. In some embodiments, the second voltage read pulse is the effective read pulse because during application of the second voltage read pulse, current associated with the selected memory cell is measured and the state of the cell (i.e., SET state or RESET state) is determined.

There are many technical effects of various embodiments. For example, read sense margin, for correctly reading data from the memory cells, is increased (i.e., improved) by cancelling the drift in the threshold voltages. The double pulse read technique of various embodiments provides a higher read sense margin than known drift mitigating techniques without SET/RESET read disturb and without drift in SET threshold. Here, SET threshold generally refers to a threshold voltage for reading a first state (e.g., logic high) in the memory cell, while RESET threshold generally refers to a threshold voltage for reading a second state (e.g., logic low) in the memory cell, where the SET threshold is different than the RESET threshold.

The drift cancelling techniques of various embodiments enables multi-threshold non-volatile memories with little overhead. Multi-threshold non-volatile memories are memories in which multiple states (e.g., bit patterns 00, 01, 10, 11) can be stored or programmed in one memory cell, such that each state is stored or programmed in a different threshold level of the that memory cell.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or wireless connection between the things that are connected, without any intermediary devices. The term "coupled" means either a direct electrical or wireless connection between the things that are connected or an indirect connection through one or more passive or active intermediary devices. The term "signal" means at least one current signal, voltage signal or data/clock signal. The meaning of "a," "an," and "the" include plural references. The meaning of "in" includes "in" and "on."

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 illustrates memory architecture 100 with an apparatus to cancel drift, according to some embodiments of the disclosure. In some embodiments, architecture 100 includes memory 101 and processor 102. In some embodiments, memory 101 includes a Memory Controller 104 and Memory Array 106. In some embodiments, Memory 101 is a Solid State Drive (SSD). In other embodiments, other types of storage units may be used. In some embodiments, Processor 102 is a microprocessor (such as those designed by Intel Corporation of Santa Clara, Calif.), Digital Signal Processors (DSPs), Field-Programmable Gate Arrays (FPGAs), Application Specific Integrated Circuits (ASICs), or Radio-Frequency Integrated Circuits (RFICs), etc.

In some embodiments, Processor 102 is coupled to Memory Controller 104 by bus 108. Bus 108 is coupled to an input-output (I/O) interface 103 of Memory 101, where I/O interface 103 receives input data (data_in) and provides output data (data_out). Other control signals are also received by Memory 101 through I/O interface 103. In some embodiments, Processor 102 is a memory controller. In some embodiments, Processor 102 is a central processing unit (CPU) having one or more processing cores. In some embodiments, the CPU also includes a memory controller. In some embodiments, I/O interface 102 is coupled to Processor 102 via a Host interface (not shown).

In some embodiments, I/O interface 103 is a Serial Advanced Technology Attachment (SATA) interface and bus 108 is a SATA compliant bus coupling SSD 101 to Processor 102 via a Host interface. In other embodiments, other types of I/O interfaces may be used for I/O interface 103. For example, Serial Attached Small Computer System Interface (SCSI) (or simply SAS) may be used for I/O interface 103, and bus 108 is a SAS compliant interface; or Peripheral Component Interconnect Express (PCIe) as described in the PCI Express Base 3.0 Specification may be used for I/O interface 103.

In some embodiments, Processor 102 may provide read and/or write requests including memory address(es), and/or associated data (i.e., data_in) to Memory Controller 104 and may receive read data (i.e., data_out) from Memory Controller 104 via I/O interface 103. In some embodiments, Memory Controller 104 performs memory access operations. For example, Memory Controller 104 reads a destination memory cell and/or writes to a destination memory cell. It should be noted that architecture 100 is simplified for ease of illustration and description.

In some embodiments, Memory Array 106 is configured to store binary data and may be written to (i.e., programmed) or read from. In some embodiments, Memory Array 106 corresponds to at least a portion of a three dimensional (3D) cross-point memory and includes a plurality of WLs 115, a plurality of BLs 117 and a plurality of memory cells, e.g., memory cell 107a. While various embodiments are described with reference to 3D cross-point Phase Change Memory (PCM), other memories may be used.

For example, memories made from materials that are operable to refresh or cancel at least one of their properties (e.g., threshold voltage) upon application of a voltage. The term "refresh" or "cancel" here generally refers to moving a shifted property or characteristic of a material to its optimum level. For example, by refreshing or cancelling the drift, the shifted voltage threshold (i.e., the drift) of a PCM is moved to its optimum or normal read voltage level. While the various embodiments describe the material property as a threshold voltage, other types of material properties that are refreshable (shift-able or cancelable) may also be used.

In some embodiments, the plurality of memory cells in Memory Array 106 exhibit reversible phase change in its non-volatile memory cells from relatively amorphous phase to relatively crystalline phase. Various embodiments are applicable to any material type that exhibits a property where a first high voltage read is able to either refresh (or cancel) the drift or refresh (or cancel) any other characteristic of the material, such that a subsequent second low voltage read is more likely to correctly read data stored in the material.

In some embodiments, each memory cell in Memory Array 106 is coupled between a WL and a BL at a cross-point of the WL and the BL. For example, memory cell 107 is coupled to $WL_1$ 115a and $BL_1$ 117a. One example of memory cell 107 is illustrated with reference to FIG. 2. FIG. 2 illustrates a cross-point memory cell 200 (e.g., 107) with a storage unit 201 and a selector unit 202, where storage unit 201 is operable to cancel drift, according to some embodiments of the disclosure. It is pointed out that those elements of FIG. 2 having the same reference numbers (or names) as the elements of any other figure can operate or function in any manner similar to that described, but are not limited to such.

In some embodiments, storage unit 201 (i.e., memory element) is configured to store information and is coupled to selector unit 202 (i.e., memory cell selector). In some embodiments, selector unit 202 may be one or more of ovonic threshold switch, diode, Bipolar Junction Transistor (BJT), Field Effect Transistor (FET), etc. During normal operation, the PCM stores information in storage unit 201 by changing the phase of storage unit 201 between amorphous and crystalline phases. The chalcogenide material may exhibit either a crystalline or an amorphous phase, exhibiting a low or high conductivity. Generally, the amorphous phase has a low conductivity (i.e., high impedance) and is associated with a RESET state (i.e., logic zero) and the crystalline phase has a high conductivity (i.e., low impedance) and is associated with a SET state (i.e., logic one).

In some embodiments, both storage unit 201 and selector unit 202 are made of chalcogenide or chalcogenide like materials. However, the embodiments are not limited to such. For example, in some embodiments, only one of storage unit 201 of selector unit 202 is a chalcogenide or chalcogenide like device. In some embodiments, a single chalcogenide device is used as both storage unit 201 and selector unit 202. In some embodiments, as selector unit 202, the chalcogenide is in the amorphous state, while as storage unit 201, chalcogenide can be in either crystalline or amorphous states.

For example, when the chalcogenide material is in a crystalline state, storage unit 201 is in a SET state (i.e., storing a logic one) while when the chalcogenide material is in an amorphous state, storage unit 201 is in a RESET state (i.e., storing a logic zero). In some embodiments, when the storage unit 201 is in a crystalline state, the overall memory cell threshold voltage (Vt) is the Vt of the selector unit 202. In some embodiments, when storage unit 201 is in an amorphous state, the overall memory cell Vt is the sum of threshold voltages of selector unit 202 and storage unit 201.

Referring to FIG. 1, in some embodiments, Memory Controller 104 includes Memory Module 110, WL Control Module 114 and BL Control Module 116. In some embodiments, Memory Module 110 is to perform operations associated with memory controller 104. For example, Memory Module 110 may manage communications with Processor 102. In some embodiments, Memory Module 110 may be configured to identify one or more destination WLs (e.g., one of $WL_0$ through $WL_N$) associated with each received memory address. In some embodiments, Memory Module 110 manages operations of WL Control Module 114 and BL control module 116 based, at least in part, on the destination WL identifiers.

In some embodiments, WL Control Module 114 includes WL Switch Circuitry 120 and WL Float Module 122. In some embodiments, WL Control Module 114 is configured to receive destination WL address(es) from Memory Module 110 and to select one or more WLs for reading and/or writing operations. In some embodiments, WL Control Module 114 is operable to select a destination WL (e.g., $WL_1$) by coupling a WL select bias voltage $V_{SELWL}$ to the destination WL and is configured to deselect a WL by coupling a WL deselect bias voltage $V_{DESWL}$ to the WL. In some embodiments, WL Control Module 114 may be coupled to a plurality of WLs 115 included in Memory Array 106. Each WL may be coupled to a number of memory cells corresponding to a number of BLs 117 (e.g., $BL_1$-$BL_N$).

In some embodiments, WL Control Module 114 includes Bias Logic 130 which can be coupled to at least one memory cell of the plurality of memory cells. In some embodiments, Bias Logic 130 is operable to generate WL select bias voltage $V_{SELWL}$ and WL deselect bias voltage $V_{DESWL}$. In some embodiments, Bias Logic 130 is operable to apply a first read voltage to the at least one memory cell. In some embodiments, Bias Logic 130 is operable to apply a second read voltage to the at least one selected memory cell, where the first read voltage being higher than the second read voltage WL Switch Circuitry 122 may include a plurality of switches, each switch configured to couple (or decouple) a respective WL, e.g., WL 115a, to $V_{SELWL}$ to select the respective WL 115a. For example, WL Switch Circuitry 122 may include a plurality of transistors. In some embodiments, WL Switch Circuitry 122 may include switches that are configured to have a full ON state, a full OFF state, a partially OFF state, and a Float State.

Full ON state corresponds to very low impedance (e.g., shorted) state and full OFF state corresponds to very high impedance state (e.g., open circuit). Partially OFF state corresponds to a conduction state between open and shorted. Float State corresponds to a state where the WL is not driven (e.g., the WL driver is tri-stated). In some embodiments, WL Float Module 125 is operable to float the WL after the WL is pre-charged to a predetermined voltage level (e.g., half of the read voltage or some other fraction of normal read voltage).

In some embodiments, BL Control Module 116 includes BL Switch Circuitry 124. In some embodiments, BL Control Module 116 includes BL Float Module 126. In some embodiments, BL Float Module 126 is operable to float the BL after the BL is pre-charged to a predetermined voltage level (e.g., half of the read voltage or some other fraction of normal read voltage). In some embodiments, BL Control Module 116 is configured to select one or more BLs for reading and/or writing operations. In some embodiments, BL Control Module 116 is operable to select a destination BL (e.g., $BL_1$) by coupling a BL select bias voltage $V_{SELBL}$ to the destination BL and may be configured to deselect a BL by coupling a BL deselect bias voltage $V_{DESBL}$ to the BL.

In some embodiments, BL Switch Circuitry 124 is similar to WL Switch Circuitry 120 except BL Switch Circuitry 124 is configured to couple $V_{SELBL}$ to a destination BL. For example, in response to a signal from Memory Module 110, WL Control Module 114 and BL Control Module 116 may be configured to select a destination memory cell, e.g. memory cell 107, for a read operation by coupling WL 115a to $V_{SELWL}$ and BL 117a to $V_{SELBL}$.

In some embodiments read or write operations may be respectively performed by read logic or write logic which may be separate from one another, or combined such as in Read/Write (R/W) Module 140. In some embodiments, R/W Module 140 may be part of Memory Module 110. In other embodiments, R/W Module 140 may be separate from, but communicatively coupled to, Memory Module 110. In some embodiments, R/W Module 140 may be part of, or otherwise coupled to, Memory Array 106. In some embodiments, R/W Module 140 is distributed across Memory Controller 104. In some embodiments, R/W Module 140 is implemented as hardware, firmware, software, or their combination. In some embodiments, read logic, such as one in R/W Module 140, is operable to perform two different read operations—first read operation and second read operation (i.e., double read operation).

In some embodiments, the first read operation is a dummy read operation which is used to reset or refresh the drift in the memory material. In some embodiments, the first read operation comprises pre-charging of one of WL or a BL. Then, in some embodiments, one of the pre-charged WL or the pre-charged BL is floated by WL Float Module 125 or BL Float Module 126, respectively.

For example, the floated line (either WL or BL) is pre-charged to approximately half the read voltage, or some other fraction of the read voltage. In some embodiments, voltage of one of the un-floating line (either WL or BL) is increased to a voltage sufficient to select at least one memory cell from a plurality of memory cells. In some embodiments, voltage of one of the un-floating lines is increased such that the full read voltage is applied to the selected memory cell. This increased voltage is the first read voltage. In some embodiments, voltage of one of the un-floating WL or BL is increased to a voltage sufficient to select at least one memory cell from a plurality of memory cells. For example, $WL_1$ or $BL_1$ is increased to a high voltage to refresh the drift in the chalcogenide memory material.

The first read operation technique here is also referred to as the full-float read technique, where the BL (or the WL) bias is applied on a floating WL (or BL) to reduce transient current flowing in the memory cell due to the reduction of the effective capacitance. In some embodiments, the full-float read technique does not affect the Vt value of the memory cell. As such, no program effect can occur for both SET and RESET memory cells. Since the full-float read technique can remove any drift without disturbing or programming the memory cell, the full-float read technique enables multi-level application. In some embodiments, for multi-level memory cells, multiple read pulses are applied.

In some embodiments, Bias Logic 130 is used to bias the WL and/or a BL to a first read voltage and then to a second read voltage, where the first read voltage is a high voltage (e.g., higher than a normal read voltage) and the second read voltage is a normal read voltage. In some embodiments, R/W Module 140 controls Bias Logic 130 to determine when to apply the first and second read pulses. In some embodiments, Bias Logic 130 is integrated within R/W Module 140.

In some embodiments, after selecting the at least one memory cell, the first read voltage is applied by Bias Logic 130 to the selected at least one memory cell. In some embodiments, applying the first read voltage is performed by applying a first read pulse whose amplitude is sufficient to cancel the drift in the selected memory cell. In some embodiments, the first high voltage pulse cancels or removes the drift without disturbing or programming the selected (and/or unselected) cells.

In some embodiments, the first read pulse "thresholds" all the memory cells to reset the drift. For example, the first read pulse of high voltage is applied to all memory cells (which may be SET or RESET memory cells) to cancel any drift in those memory cells. In some embodiments, upon applying the highest bias voltage allowed by the process technology to the memory cells via a read pulse, the drift is removed (i.e., the threshold of the memory cell reverts back to the value just after being programmed). In some embodiments, data is not retrieved upon application of the first read operation, which is why the first read operation is sometimes referred to as a dummy read operation.

In some embodiments, after the first read pulse completes (or ends), the second read operation is applied (or begins). For example, the first read pulse completes (or ends) after the falling edge of the first read pulse. In some embodiments, performing the second read operation comprises applying a second read voltage to the selected at least one memory cell without floating the WL or the BL. In some embodiments, the second read voltage is applied as a second read pulse, which is applied (or begins) after the first read pulse completes (or ends). For example, the rising edge of the second read pulse begins after the falling edge of the first read pulse. Since the drift is cancelled after the first read operation, the second read bias does not need to be change over time and can be the same for all the memory cells at any time, in accordance to some embodiments.

In some embodiments, the second read voltage is a normal read voltage. In some embodiments, the voltage level of normal read voltage is lower than the first read voltage. In some embodiments, the second low voltage read pulse is the effective read pulse because during application of the second low voltage read pulse, current associated with the selected memory cell is measured and the state of the cell (i.e., SET state or RESET state) is determined.

Graphical representation of the first and second read operations is described with reference to FIGS. 3-5, in accordance to some embodiments.

Figure 3:
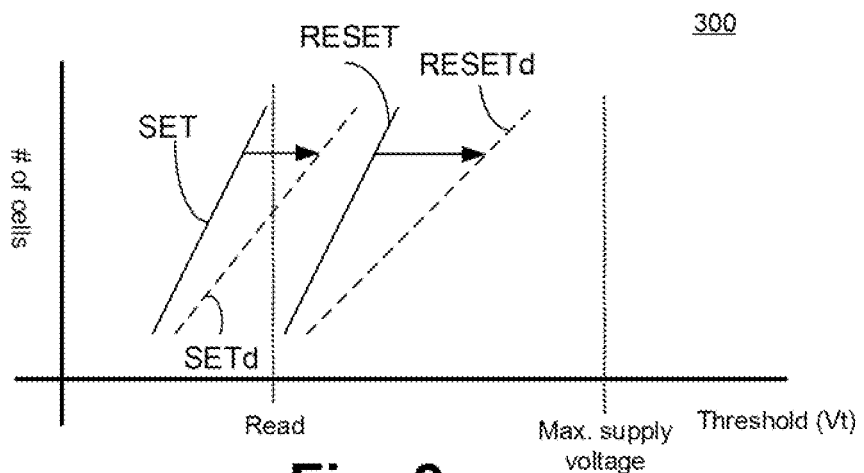
FIG. 3 illustrates a plot showing drift to SET and RESET thresholds.

FIG. 3 illustrates plot 300 showing drift to SET and RESET thresholds. It is pointed out that those elements of FIG. 3 having the same reference numbers (or names) as the elements of any other figure can operate or function in any manner similar to that described, but are not limited to such. Here, x-axis is threshold voltage while y-axis is number of memory cells.

The two solid lines for SET and RESET indicate the distribution of threshold voltage for a number of memory cells in Memory Array 106 before any drift to the threshold voltages. Prior to drift, the memory window is satisfactory which is defined as a threshold difference between the maximum SET threshold and a minimum RESET threshold. Here, the maximum RESET threshold is below the maximum supply voltage, and the distribution of SET thresholds does not overlap the distribution of RESET thresholds. As such, to read data from a memory cell, read bias (i.e., Read) can be applied at a voltage level between just above the highest SET threshold voltage level and just below the lowest RESET threshold voltage level. This read bias is referred to as the optimum read bias.

When the memory cell is in SET state, a read operation corresponds to the threshold event (i.e., threshold of selector unit 202) which brings a significant amount of current flowing in the memory cell. This current flow allows for fast read. Read operation can be performed above the RESET threshold voltage or below the lowest SET threshold, in accordance with some embodiments. In the case where the read operation is performed below the lowest SET threshold, the lower SET threshold may correspond to a higher current detection signal but the operation may be slower due to smaller current involved.

After a program voltage is applied to a memory cell to store logic one (i.e., SET) or to store logic zero (i.e., RESET), threshold voltage distribution for SET and RESET drift. In this example, the threshold voltage distribution for SET increases to threshold voltage distribution SETd, while the threshold voltage distribution for RESET increases to threshold voltage distribution RESETd. Threshold voltage drift negatively affects the memory window because the threshold difference between the maximum SETd threshold and a minimum RESETd threshold reduces or simply does not exist. In some cases, the increase in the threshold of storage unit 201 and selector unit 202 reduces the memory window. In some cases, the optimum read point or read bias shifts in a high threshold state which may be above the maximum (Max.) supply voltage that can be applied in Memory Array 106. In one example, after drift occurs, SET memory cells can be read only with higher read bias and some RESET cells may end above the maximum voltage available in Memory Array 106 and thus cannot be SET back anymore.

While FIG. 3 is described for single threshold cells, memory cells with multiple thresholds (i.e., cells that can store multiple data using different threshold voltage levels), different optimum read voltages are used for reading different logic levels in the memory cell. In multi-level application, storage unit 201 can have different threshold values depending on the amorphous volume which is programmed in it. For example, a larger amorphous volume may be programmed in storage unit 201 to obtain a larger threshold voltage. Drift in the threshold voltage levels makes reading from memory cells at different threshold voltage a challenge.

Figure 4:
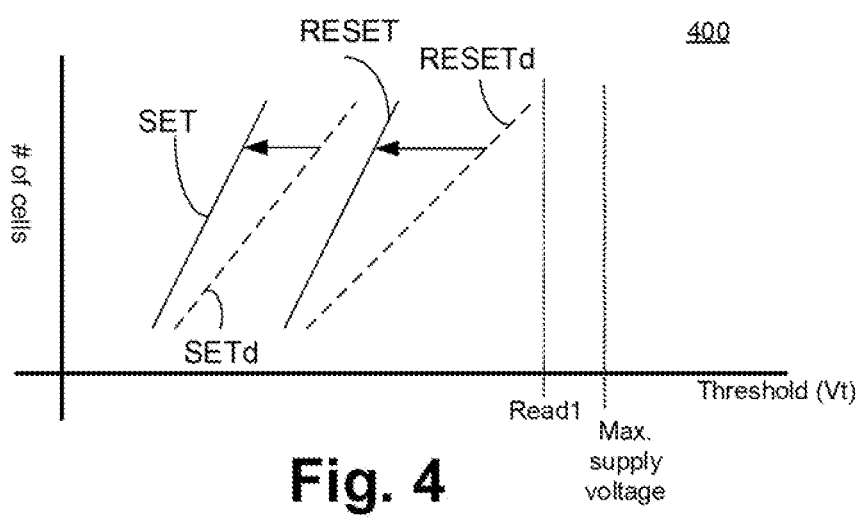
FIG. 4 illustrates a plot showing application of first read for canceling drift in SET and RESET thresholds, according to some embodiments of the disclosure.

FIG. 4 illustrates plot 400 showing application of first read for canceling drift in SET and RESET thresholds, according to some embodiments of the disclosure. It is pointed out that those elements of FIG. 4 having the same reference numbers (or names) as the elements of any other figure can operate or function in any manner similar to that described, but are not limited to such. Here, x-axis is threshold voltage while y-axis is number of memory cells. FIG. 4 is described with reference to FIG. 3.

In some embodiments, to cancel the drift (i.e., to revert the threshold distributions of SETd to SET and to revert the threshold distributions of RESETd to RESET), a first read operation is performed with a read pulse (Read1) having a voltage amplitude higher than the highest threshold voltage of RESETd threshold distribution. In some embodiments, amplitude of the first read pulse (i.e., Read1) is known (i.e., predetermined) at the time of manufacture after high volume testing. In some embodiments, amplitude of the first read pulse (i.e., Read1) is programmable (e.g., by software or hardware) to achieve a voltage level which is sufficient to cancel the drift without causing reliability issues. The cancelling of the drift by application of the first read pulse is indicated by the arrows from SETd to SET and from RESETd to RESET.

In some embodiments, the first read operation comprises pre-charging one of WL or a BL. Then, in some embodiments, one of the pre-charged WL or the pre-charged BL is floated by WL Float Module 125 or BL Float Module 126, respectively. In some embodiments, voltage of one of the un-floating WL or BL is increased to a voltage sufficient to select at least one memory cell from a plurality of memory cells. For example, $WL_1$ or $BL_1$ is increased to a high voltage to refresh the drift in the chalcogenide memory material.

Figure 5:
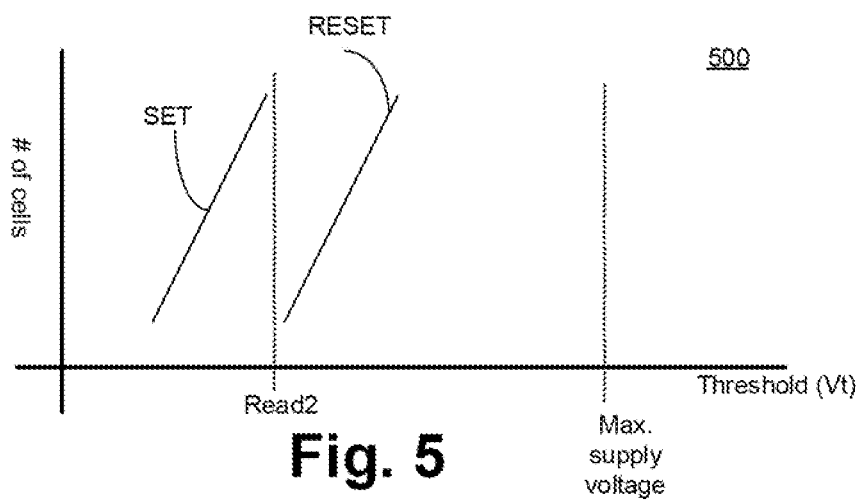
FIG. 5 illustrates a plot showing application of second read after canceling drift in SET and RESET thresholds, according to some embodiments.

FIG. 5 illustrates plot 500 showing application of second read after canceling drift in SET and RESET thresholds, according to some embodiments. It is pointed out that those elements of FIG. 5 having the same reference numbers (or names) as the elements of any other figure can operate or function in any manner similar to that described, but are not limited to such. Here, x-axis is threshold voltage while y-axis is number of memory cells. FIG. 5 is described with reference to FIG. 4.

After application of the first read operation, drift is cancelled (i.e., SETd reverts to SET, and RESETd reverts to RESET). In some embodiments, after the first read operation completes, a second read operation is applied with a read pulse which is the normal read pulse (i.e., a read threshold voltage of Read2 which is above the highest SET threshold voltage and below the lowest RESET threshold voltage).

In some embodiments, performing the second read operation comprises applying a second read voltage to the selected at least one memory cell without floating the WL or the BL. In some embodiments, the second read voltage is applied as a second read pulse, which is applied after the first read pulse completes. Since the drift is cancelled after the first read operation, the second read bias does not need to be changed over time and can be the same for all the memory cells at any time, in accordance to some embodiments.

In some embodiments, the second read voltage is a normal read voltage. In some embodiments, voltage level of normal read voltage is lower than the first read voltage. In some embodiments, the second low voltage read pulse is the effective read pulse because during application of the second low voltage read pulse, current associated with the selected memory cell is measured and the state of the cell (i.e., SET state or RESET state) is determined.

Figure 6:
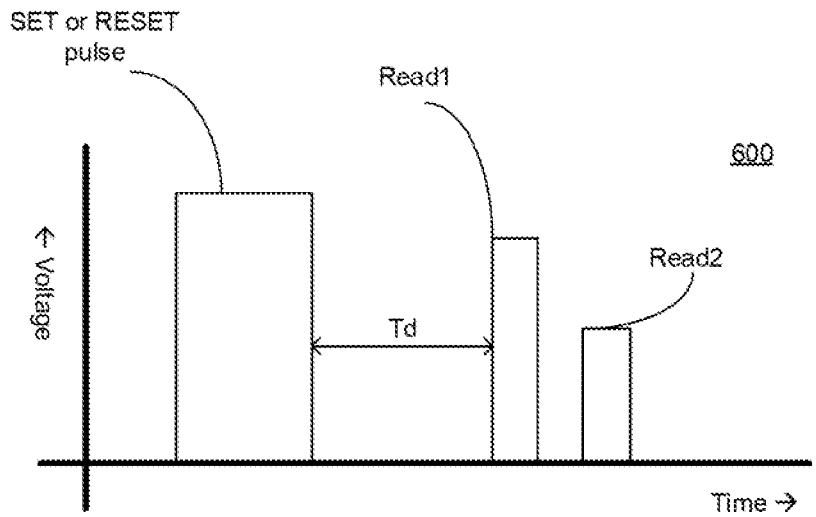
FIG. 6 illustrates a plot showing a timing diagram of a method for canceling drift, according to some embodiments of the disclosure.

FIG. 6 illustrates plot 600 showing timing diagram of a method for canceling drift, according to some embodiments of the disclosure. It is pointed out that those elements of FIG. 6 having the same reference numbers (or names) as the elements of any other figure can operate or function in any manner similar to that described, but are not limited to such. Here, x-axis is time and y-axis is voltage.

After application of SET or RESET write pulse for a selected memory cell, data (i.e., SET or RESET) is written to that memory cell. The operation of writing data may cause the material for storage unit 201 and/or selection unit 202 to change its threshold characteristics. For example, the thresholds of the memory cells may increase (i.e., drift) after application of the write pulse.

In some embodiments, after the write pulse is applied and after a duration Td from the completion of the write pulse, the first read operation is performed as indicated by Read1 pulse. In some embodiments, voltage amplitude of Read1 pulse is higher than the voltage amplitude of Read2 pulse (i.e., normal read pulse), but lower than the voltage level of the write pulse (i.e., SET or RESET pulse). In some embodiments, voltage amplitude of Read1 pulse is higher than the voltage amplitude of Read2 pulse (i.e., normal read pulse), and higher than the voltage level of the write pulse (i.e., SET or RESET pulse).

After application of the first read pulse Read1 (as described with reference to the first read operation of various embodiments), second read pulse Read2 is applied. In some embodiments, the second read pulse has a voltage amplitude which is the same as the optimum read voltage. In some embodiments, for multi-level memory cells, multiple read operations are performed after the first read operation, where the multiple read operations have different read voltages (i.e., different read pulse amplitudes) to read data stored at different threshold voltage levels in the memory cell.

Figure 7:
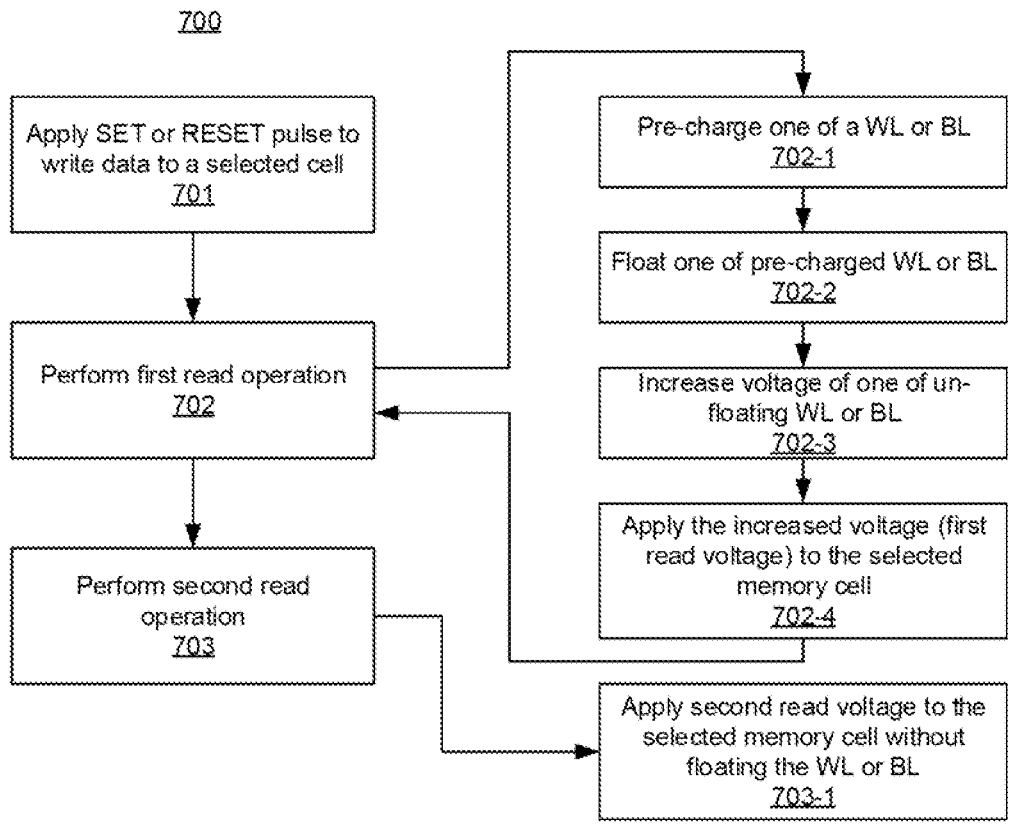
FIG. 7 illustrates a flowchart of a method for cancelling drift, according to some embodiments of the disclosure.

FIG. 7 illustrates a flowchart of a method for cancelling drift, according to some embodiments of the disclosure. It is pointed out that those elements of FIG. 7 having the same reference numbers (or names) as the elements of any other figure can operate or function in any manner similar to that described, but are not limited to such.

Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 701, SET or RESET pulse (i.e., write pulse) is applied to a selected memory cell to write to that memory cell. The memory cell may a single threshold cell or a multiple threshold cell. As described here, application of the write pulse causes drift. At block 702, first read operation is performed. The process of first read operation is outlined by blocks 702-1 through 702-4, in accordance to some embodiments.

At block 702-1, one of WL or BL is pre-charged. For example, the WL or BL is pre-charged to approximately half the normal read voltage. In some embodiments, the WL or BL is pre-charged to one-third or some other fraction of the normal read voltage. At block 702-2, the pre-charged WL or BL is then floated. In some embodiments, one of the pre-charged WL or the pre-charged BL is floated by WL Float Module 125 or BL Float Module 126, respectively. In some embodiments, one of the WL or BL is floated, and then the floated line (i.e., either WL or BL) is pre-charged to approximately half the read voltage (or a fraction of the normal read voltage).

At block 702-3, voltage for one of the un-floating WL or BL is increased. In some embodiments, voltage of one of the un-floating WL or BL is increased to a voltage so it is sufficient to select at least one memory cell from a plurality of memory cells. For example, $WL_1$ or $BL_1$ is increased to a high voltage which is sufficient to refresh the drift in the chalcogenide memory material. At block 702-4, the increased voltage (i.e., first read voltage Read1) is applied to the selected memory cell to refresh the drift in the chalcogenide memory material.

At block 703, second read operation is applied after the first operation completes. A simplified outline of the second read operation is described with reference to block 703-1. At block 703-1, a second read voltage (i.e., Read2 pulse) is applied to the memory cell without floating the WL or BL. In some embodiments, the second read voltage is applied as a second read pulse, which is applied after the first read pulse completes. Since the drift is cancelled after the first read operation, the second read bias does not need to be change over time and can be the same for all the memory cells at any time, in accordance to some embodiments.

In some embodiments, the second read voltage is a normal read voltage. In some embodiments, the voltage level of normal read voltage is lower than the first read voltage. In some embodiments, the second low voltage read pulse is the effective read pulse because during application of the second low voltage read pulse, current associated with the selected memory cell is measured and the state of the cell (i.e., SET state or RESET state) is determined.

In some embodiments, multiple read operations are performed like the second read operation to read data programmed at different threshold voltage levels. As such, multi-threshold memory is enabled in such memories. In some embodiments, after every SET/RESET write pulse application, the double read operation is applied to cancel any drift in the threshold voltages. In some embodiments, the double read operation is applied only once after the first SET/RESET write pulse is applied. In some embodiments, the double read operation is applied periodically after a predetermined or programmable number of SET/RESET write pulse applications.

In some embodiments, the program software code/instructions associated with flowchart 700 are stored in a computer executable storage medium and executed by a terminal device. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowchart 700) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, a tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA, a cellular phone, a notebook computer, a tablet, a game console, a set top box, an embedded system, a TV, a personal desktop computer, etc. Alternatively, the traditional communication applications and subsidized application(s) may be used in some embodiments of the disclosed subject matter.

Figure 8:
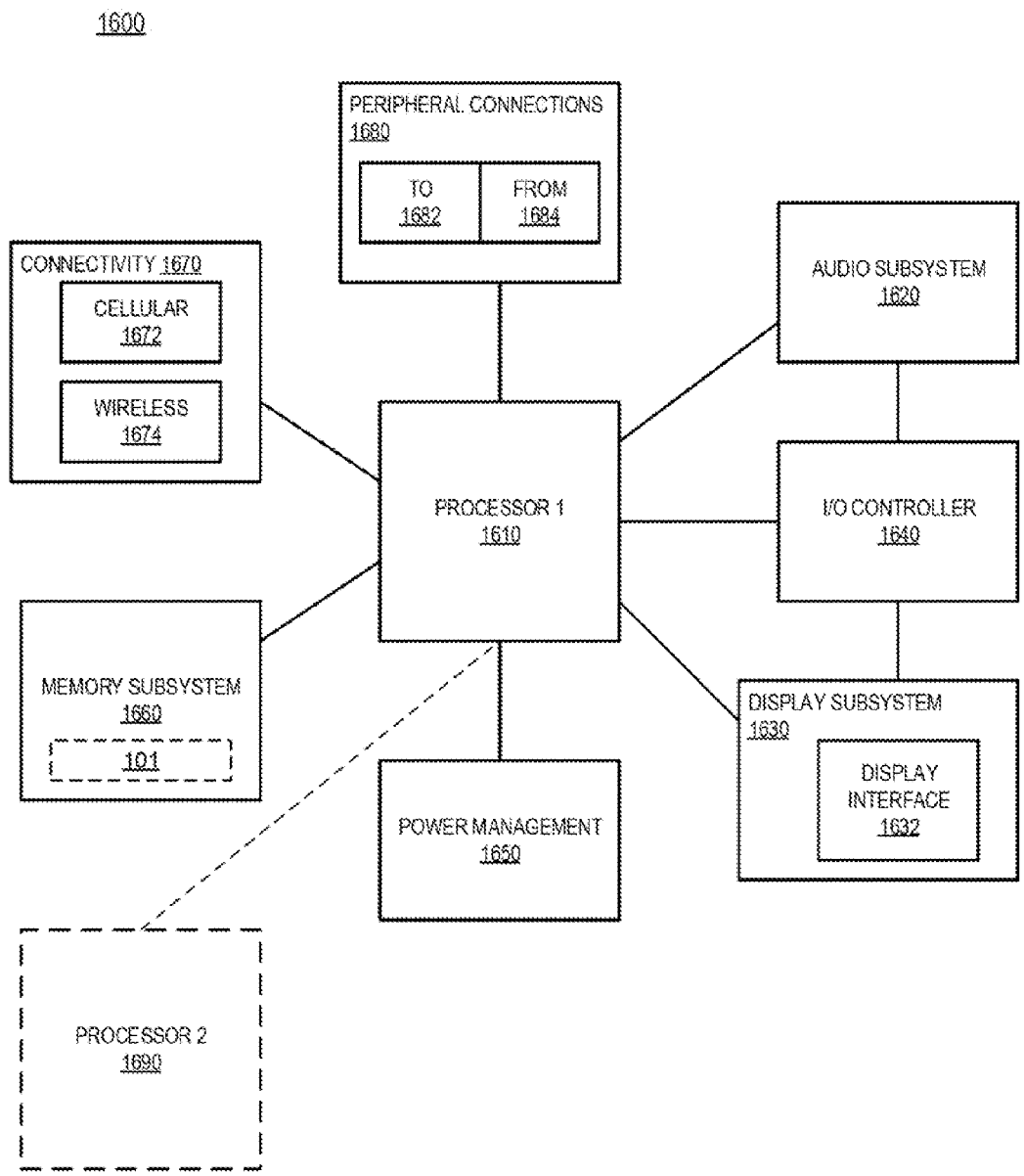
FIG. 8 illustrates a smart device or a computer system or a SoC (System-on-Chip) with apparatus to cancel drift, according to some embodiments.

FIG. 8 illustrates a smart device or a computer system or a SoC (System-on-Chip) with apparatus to cancel drift, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 apparatus to cancel drift, according to some embodiments discussed. Other blocks of the computing device 1600 may also include apparatus to cancel drift, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 includes Display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 includes I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. In some embodiments, Memory subsystem 1600 includes apparatus to cancel drift, according to some embodiments. In some embodiments, Memory subsystem 1600 is an SSD such as SSD 101 with apparatus to cancel drift.

Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, PCM, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a plurality of memory cells; a bias logic coupled with at least one memory cell of the plurality, the bias logic to: apply a first read voltage to the at least one memory cell; and apply a second read voltage to the at least one memory cell, the first read voltage being higher than the second read voltage; and a first circuit operable to float a word-line coupled to the at least one memory cell before the bias logic applies the first read voltage to the at least one memory cell.

In some embodiments, the first read voltage is applied before the second read voltage. In some embodiments, the first and second read voltages are applied as first and second read pulses such that the first read pulse ends before the second read pulse begins. In some embodiments, the first read pulse has an amplitude which is sufficient to cancel drift in the at least one memory cell. In some embodiments, the first read pulse has an amplitude which is greater than a SET threshold but lower than a RESET threshold. In some embodiments, the apparatus comprises: a second circuit to pre-charge the word-line; and a third circuit to increase voltage to a bit-line to select the at least one memory cell.

In some embodiments, the second circuit to pre-charge the word-line prior to the first circuit floats the word-line, and wherein the third circuit to increase the voltage to the bit-line after the first circuit floats the word-line. In some embodiments, the plurality of memory cells are multi-level cells (MLCs) or single-level cells (SLCs). In some embodiments, the plurality of memory cells exhibit reversible phase change from relatively amorphous phase to relatively crystalline phase. In some embodiments, the plurality of memory cells are formed of a material that is operable to refresh at least one property of the material upon application of the first read voltage.

In another example, a system is provided which comprises: a processor; a memory coupled to the processor, the memory having: an array of plurality of memory cells; and a memory controller coupled to the array, the memory controller including: a bias logic coupled with at least one memory cell of the plurality, the bias logic to: apply a first read voltage to the at least one memory cell; and apply a second read voltage to the at least one memory cell, the first read voltage being higher than the second read voltage; and a first circuit operable to float a word-line coupled to the at least one memory cell before the bias logic applies the first read voltage to the at least one memory cell; and a wireless interface to allow the processor to communicate with another device. In some embodiments, the memory controller includes apparatus according to the apparatus described above.

In another example, a method is provided which comprises: performing a first read operation to at least one memory cell; and performing a second read operation to the at least one memory cell after the first read operation completes, wherein the second read operation is different from the first read operation. In some embodiments, performing the first read operation comprises: pre-charging one of a word-line or a bit-line; floating one of the pre-charged word-line or the pre-charged bit-line; increasing voltage of one of the un-floating word-line or bit-line to select the at least one memory cell from a plurality of memory cells; and applying a first read voltage to the selected at least one memory cell of a plurality of memory cells.

In some embodiments, performing the second read operation comprises: applying a second read voltage to the selected at least one memory cell without floating the word-line or the bit-line. In some embodiments, the first read voltage is higher than the second read voltage. In some embodiments, applying the first and second read voltages comprises applying first and second read pulses, respectively, such that the first read pulse ends before the second read pulse begins. In some embodiments, wherein applying the first read pulse comprises applying a pulse having an amplitude sufficient to cancel drift in the at least one memory cell. In some embodiments, the memory cell is formed of a material that is operable to refresh at least one property of the material upon application of the first read voltage.

In another example, an apparatus is provided which comprises: means for performing a first read operation to at least one memory cell; and means for performing a second read operation to the at least one memory cell after the first read operation completes, wherein the second read operation is different from the first read operation. In some embodiments, the means for performing the first read operation comprises: means for pre-charging one of a word-line or a bit-line; means for floating one of the pre-charged word-line or the pre-charged bit-line; means for increasing voltage of one of the un-floating word-line or bit-line to select the at least one memory cell from a plurality of memory cells; and means for applying a first read voltage to the selected at least one memory cell of a plurality of memory cells.

In some embodiments, the means for performing the second read operation comprises: means for applying a second read voltage to the selected at least one memory cell without floating the word-line or the bit-line. In some embodiments, the first read voltage is higher than the second read voltage. In some embodiments, the means for applying the first and second read voltages comprises means for applying first and second read pulses, respectively, such that the first read pulse ends before the second read pulse begins. In some embodiments, the means for applying the first read pulse comprises means for applying a pulse having an amplitude sufficient to cancel drift in the at least one memory cell. In some embodiments, the memory cell is formed of a material that is operable to refresh at least one property of the material upon application of the first read voltage.

In another example, a system is provided which comprises: a processor; a memory coupled to the processor, the memory including an apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a plurality of memory cells;
   a bias logic coupled with at least one memory cell of the plurality, the bias logic to:
      apply a first read voltage to the at least one memory cell; and
      apply a second read voltage to the at least one memory cell, the first read voltage being higher than the second read voltage; and
   a first circuit operable to float a word-line coupled to the at least one memory cell before the bias logic applies the first read voltage to the at least one memory cell.

2. The apparatus of claim 1, wherein the first read voltage is to be applied before the second read voltage.

3. The apparatus of claim 1, wherein the first and second read voltages are to be applied as first and second read pulses such that the first read pulse is to end before the second read pulse is to begin.

4. The apparatus of claim 3, wherein the first read pulse has an amplitude which is sufficient to cancel drift in the at least one memory cell.

5. The apparatus of claim 3, wherein the first read pulse has an amplitude which is greater than a SET threshold but lower than a RESET threshold.

6. The apparatus of claim 1 comprises:
a second circuit to pre-charge the word-line; and
a third circuit to increase voltage to a bit-line to select the at least one memory cell.

7. The apparatus of claim 6, wherein the second circuit is to pre-charge the word-line prior to the first circuit is to float the word-line, and wherein the third circuit is to increase the voltage to the bit-line after the first circuit is to float the word-line.

8. The apparatus of claim 1, wherein the plurality of memory cells are multi-level cells (MLCs) or single-level cells (SLCs).

9. The apparatus of claim 1, wherein the plurality of memory cells exhibit reversible phase change from relatively amorphous phase to relatively crystalline phase.

10. The apparatus of claim 1, wherein the plurality of memory cells are formed of a material that is operable to refresh at least one property of the material upon application of the first read voltage.

11. A system comprising:
a processor;
a memory coupled to the processor, the memory having:
an array of plurality of memory cells; and
a memory controller coupled to the array, the memory controller including:
a bias logic coupled with at least one memory cell of the plurality, the bias logic to:
apply a first read voltage to the at least one memory cell; and
apply a second read voltage to the at least one memory cell, the first read voltage being higher than the second read voltage; and
a circuit operable to float a word-line coupled to the at least one memory cell before the bias logic applies the first read voltage to the at least one memory cell; and
a wireless interface to allow the processor to communicate with another device.

12. The system of claim 11, wherein the array of plurality of memory cells are formed of a material that is operable to refresh at least one property of the material upon application of the first read voltage.

13. The system of claim 11, wherein the first and second read voltages are applied as first and second read pulses such that the first read pulse ends before the second read pulse begins.

14. A method comprising:
performing a first read operation to at least one memory cell; and
performing a second read operation to the at least one memory cell after the first read operation completes, wherein the second read operation is different from the first read operation.

15. The method of claim 14, wherein performing the first read operation comprises:
pre-charging one of a word-line or a bit-line;
floating one of the pre-charged word-line or the pre-charged bit-line;
increasing voltage of one of the un-floating word-line or bit-line to select the at least one memory cell from a plurality of memory cells; and
applying a first read voltage to the selected at least one memory cell of a plurality of memory cells.

16. The method of claim 15, wherein performing the second read operation comprises:
applying a second read voltage to the selected at least one memory cell without floating the word-line or the bit-line.

17. The method of claim 16, wherein the first read voltage is higher than the second read voltage.

18. The method of claim 16, wherein applying the first and second read voltages comprises applying first and second read pulses, respectively, such that the first read pulse ends before the second read pulse begins.

19. The method of claim 16, wherein applying the first read pulse comprises applying a pulse having an amplitude sufficient to cancel drift in the at least one memory cell.

20. The method of claim 15, wherein the memory cell is formed of a material that is operable to refresh at least one property of the material upon application of the first read voltage.

* * * * *